(12) United States Patent
Lee

(10) Patent No.: US 9,478,523 B2
(45) Date of Patent: Oct. 25, 2016

(54) SEMICONDUCTOR PACKAGES AND METHODS OF FABRICATING THE SAME

(71) Applicant: Kang Joon Lee, Hwaseong-si (KR)

(72) Inventor: Kang Joon Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/795,171

(22) Filed: Jul. 9, 2015

(65) Prior Publication Data

US 2016/0141271 A1    May 19, 2016

(30) Foreign Application Priority Data

Nov. 14, 2014  (KR) .......................... 10-2014-0158823

(51) Int. Cl.

| | |
|---|---|
| H01L 23/34 | (2006.01) |
| H01L 25/065 | (2006.01) |
| H01L 23/13 | (2006.01) |
| H01L 23/544 | (2006.01) |
| H01L 23/373 | (2006.01) |
| H01L 23/31 | (2006.01) |
| H01L 21/52 | (2006.01) |
| H01L 21/56 | (2006.01) |
| H01L 21/48 | (2006.01) |
| H01L 25/00 | (2006.01) |

(52) U.S. Cl.
CPC ....... *H01L 25/0657* (2013.01); *H01L 21/4853* (2013.01); *H01L 21/52* (2013.01); *H01L 21/565* (2013.01); *H01L 23/13* (2013.01); *H01L 23/3107* (2013.01); *H01L 23/373* (2013.01); *H01L 23/544* (2013.01); *H01L 25/50* (2013.01); *H01L 2223/54426* (2013.01); *H01L 2225/06593* (2013.01)

(58) Field of Classification Search
CPC .................................................. H01L 25/0657
USPC ........................................................ 257/712
See application file for complete search history.

(56) References Cited

U.S. PATENT DOCUMENTS

| | | | |
|---|---|---|---|
| 8,283,770 | B2 | 10/2012 | Nakashiba et al. |
| 8,587,108 | B2 | 11/2013 | Youn et al. |
| 2009/0146284 | A1 | 6/2009 | Kim et al. |
| 2011/0241165 | A1 | 10/2011 | Nakashiba et al. |
| 2012/0074566 | A1 | 3/2012 | Youn et al. |
| 2014/0003903 | A1 | 1/2014 | Li et al. |

FOREIGN PATENT DOCUMENTS

| | | |
|---|---|---|
| JP | H1197580 A | 4/1999 |
| JP | 2003218290 A | 7/2003 |

(Continued)

OTHER PUBLICATIONS

Machine Translation of KR 10-2008-0054878.*

*Primary Examiner* — Anthony Ho
(74) *Attorney, Agent, or Firm* — Harness, Dickey & Pierce, P.L.C.

(57) ABSTRACT

A semiconductor package including a lower package and an upper package provided may be provided. The lower package includes a lower package substrate, a lower semiconductor chip mounted thereon, and a lower mold layer provided on the lower package substrate. The upper package includes an upper package substrate and an upper semiconductor chip thereon. The lower mold layer includes a guide portion extending along a vertical direction from an edge of the lower package substrate toward the upper package.

13 Claims, 10 Drawing Sheets

(56) References Cited

FOREIGN PATENT DOCUMENTS

| | | |
|---|---|---|
| JP | 2011166096 A | 8/2011 |
| JP | 2013115135 A | 6/2013 |
| KR | 20070062087 A | 6/2007 |
| KR | 20080054878 A | 6/2008 |

* cited by examiner

SEMICONDUCTOR PACKAGES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2014-0158823, filed on Nov. 14, 2014, in the Korean Intellectual Property Office, the entire contents of which are hereby incorporated by reference.

BACKGROUND OF THE INVENTION

Example embodiments of the inventive concepts relate to semiconductor packages, and in particular, to package-on-package type semiconductor packages with a guide portion and/or methods of fabricating the same.

In the semiconductor industry, various package technologies have been developed to meet demands for large storage, thin thickness, and small size of semiconductor devices and/or electronic appliances. One approach is a package technology in which semiconductor chips are vertically stacked to realize a high density chip stacking. This package technology can integrate many kinds of semiconductor chips in smaller areas compared to a conventional package technology with a single semiconductor chip.

SUMMARY

Some example embodiments of the inventive concepts provide package-on-package semiconductor packages configured to prevent an upper package from being misaligned to a lower package and/or methods of fabricating the same.

According to an example embodiment of the inventive concepts, a semiconductor package may include a lower package including a lower package substrate, a lower semiconductor chip on the lower package substrate, and a lower mold layer provided on the lower package substrate, and an upper package on the lower package, the upper package including an upper package substrate and an upper semiconductor chip thereon. The lower mold layer may include a guide portion extending vertically at an edge of the lower package.

In example embodiments, the guide portion may include a first portion having a uniform width in the vertical direction, and a second portion protruding from the first portion, the second portion to having a width gradually decreasing in the vertical direction.

In example embodiments, the guide portion may be a tapered structure having a width decreasing in the vertical direction.

In example embodiments, the guide portion may be a pillar-shaped structure having a uniform width in the vertical direction.

In example embodiments, when viewed in a plan view, the guide portion may be continuously provided along the edge of the lower package substrate.

In example embodiments, when viewed in a plan view, the guide portion may be discontinuously provided along the edge of the lower package substrate.

In example embodiments, when viewed in a plan view, the lower package substrate may have a rectangular shape, and the guide portion may include at least two portions, which may be respectively provided on at least two opposite corners of the lower package substrate.

In example embodiments, when viewed in a plan view, the lower package substrate may have a rectangular shape, and the guide portion may include at least two portions, which are respectively provided on at least two opposite sides of the lower package substrate.

In example embodiments, the upper package may be contained in a mounting space delimited by the guide portion of the lower mold layer.

In example embodiments, the semiconductor package may further include a heat transfer layer provided between the lower semiconductor chip and the upper package substrate.

In example embodiments, the semiconductor package may further include an upper mold layer covering the upper semiconductor chip.

In example embodiments, the lower semiconductor chip may be an application processor chip and the upper semiconductor chip may be a memory chip.

According to an example embodiment of the inventive concepts, a semiconductor package may include a lower package substrate, a lower semiconductor chip mounted on the lower package substrate, a lower mold layer provided on the lower semiconductor chip to define a mounting space, an upper package substrate provided in the mounting space of the lower mold layer, and an upper semiconductor chip mounted on the upper package substrate. The lower mold layer may include a guide portion defining a mounting space, wherein the guide portion extends horizontally along an edge of the lower package substrate and extends vertically.

In example embodiments, the guide portion may include a vertical portion extending vertically and horizontally along the side of the upper package, and a tapered portion extending vertically from the vertical portion. An inner side surface of the tapered portion may have an ascending slope and face the upper package.

In example embodiments, the guide portion may be a tapered structure. An inner side surface of the tapered portion may have an ascending slope and face the upper package.

In example embodiments, the guide portion may have a pillar shape. An inner side surface of the guide portion may face the upper package and be perpendicular to a top surface of the lower package substrate.

According to an example embodiment of the inventive concepts, a method of fabricating a semiconductor package may include providing a lower package including mounting a lower semiconductor chip on a lower package substrate, forming a lower mold layer on the lower package substrate, the lower mold layer including a guide portion extending along a vertical direction from an edge of the lower package substrate and defining a mounting space, and forming a lower solder ball on the lower package substrate and spaced apart from the lower semiconductor chip, the lower solder ball penetrating the lower mold layer and electrically connected to the lower package substrate, providing an upper package on the lower package, the upper package including an upper package substrate, an upper semiconductor chip provided on the upper package substrate, and an upper solder ball provided on the upper package substrate and spaced apart from the upper semiconductor chip, and providing the upper package in the mounting space to stack the upper package on the lower package.

In example embodiments, the stacking of the upper package may include providing a board including a board connection terminal, sequentially stacking the lower package on the board and the upper package on the lower package, and performing a reflow process to form a connection terminal by combining the board connection terminal with an outer terminal provided on the lower package substrate.

In example embodiments, the sequential stacking of the upper package may include forming a connection terminal electrically connecting the upper and lower packages to each other by combining the lower solder ball with the upper solder ball performing using a reflow process.

In example embodiments, the forming a lower mold layer may include providing a molding die to be in contact with a top surface of the lower semiconductor chip, the molding die including a concave portion formed in a vertical direction oriented from an edge of the lower package substrate toward the top surface of the lower semiconductor chip, and supplying a molding material in the molding die.

According to an example embodiment of the inventive concepts, a semiconductor package includes a lower package including a lower package substrate, a lower semiconductor chip on the lower package substrate, and a lower mold layer on the lower package substrate, the lower mold layer including a first portion at and around the lower semiconductor chip, and a second portion connected to the first portion at an edge of the lower package, the second portion extending in a vertical direction from the first portion to define a boundary, and an upper package on the lower package, the upper package including an upper package substrate and an upper semiconductor chip thereon, the upper package guided by the second portion to reside within the boundary.

In example embodiments, a width of the second portion may decrease as being farther away from the lower package substrate.

In example embodiments, a width of the second portion may be uniform in the vertical direction.

In example embodiments, when viewed in a plan view, the second portion may include at least two separate members on at least one of at least two opposite corners of the lower package substrate and at least two opposite corners of the lower package substrate.

In example embodiments, when viewed in a plan view, the second portion may be along the edge of the lower package substrate in one of a continuous manner and a discontinuous manner.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
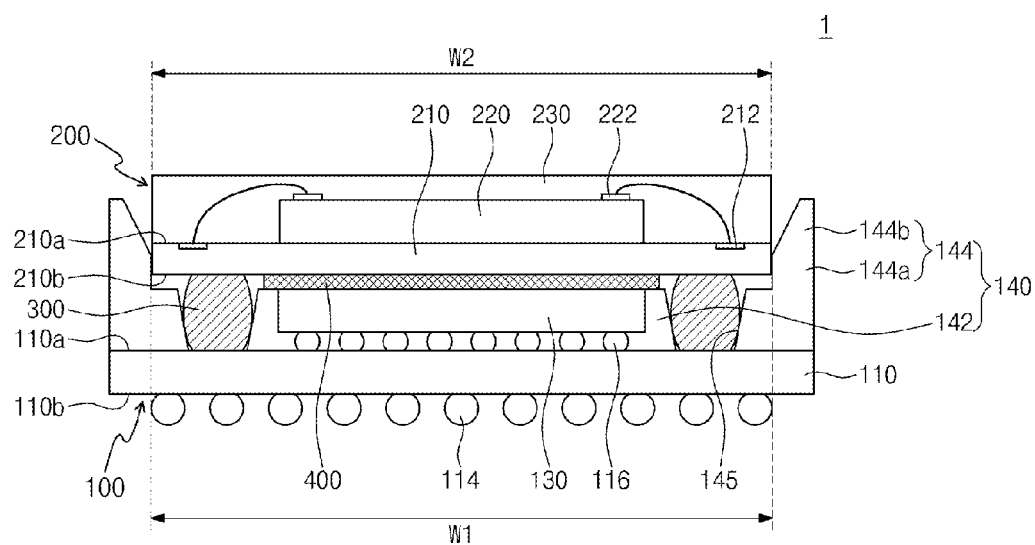
FIG. 1 is a sectional view illustrating a semiconductor package according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments of the inventive concepts will now be described more fully with reference to the accompanying drawings, in which some example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a semiconductor package according to an example embodiment of the inventive concepts.

Referring to FIG. 1, a semiconductor package 1, according to an example embodiment of the inventive concepts, may include a lower package 100 and an upper package 200 electrically connected to each other via a connection terminal 300 (e.g., a solder ball). A heat transfer layer 400 may be disposed between the lower package 100 and the upper package 200. The lower package 100 may include a lower package substrate 110, a lower semiconductor chip 130, and a lower mold layer 140. The upper package 200 may include an upper package substrate 210, an upper semiconductor chip 220, and an upper mold layer 230.

The lower package substrate 110 may be a printed circuit board (PCB) with circuit patterns. The lower package substrate 110 may have a top surface 110a facing the upper package substrate 210 and a bottom surface 110b opposite to the top surface 110a. An outer terminal 114 (e.g., a solder ball) may be provided on the bottom surface 110b of the lower package substrate 110. The lower semiconductor chip 130 (e.g., a logic chip, a memory chip, or combination thereof) may be mounted on the top surface 110a of the lower package substrate 110.

A connection terminal 116 (e.g., a solder ball or a solder bump) may be provided between the lower semiconductor chip 130 and the lower package substrate 110 to electrically connect the lower semiconductor chip 130 to the lower package substrate 110.

The lower mold layer 140 may be provided on the lower package substrate 110 to enclose the lower semiconductor chip 130. The lower mold layer 140 may be formed of or include an insulating polymer material (e.g., an epoxy molding compound (EMC)). The lower mold layer 140 may include a central portion 142 and a guide portion 144. As an example, the central portion 142 may be formed to cover a sidewall of the lower semiconductor chip 130 and expose a top surface of the lower semiconductor chip 130. The central portion 142 may have a top surface substantially coplanar with that of the lower semiconductor chip 130. As another example, the central portion 142 may be provided to cover the entire top surface of the lower semiconductor chip 130. The central portion 142 of the lower mold layer 140 may include a connection hole 145, in which the connection terminal 300 is provided.

The guide portion 144 may extend at an edge portion of the lower package substrate 110 in a vertical direction. In the vertical direction or vertically means in a direction normal to the top surface of the lower semiconductor chip, and in the horizontal direction or horizontally means in a direction tangential to the top surface of the lower semiconductor chip. The guide portion 144 may define a mounting space, in which the upper semiconductor package 200 is contained or inserted. The mounting space may have a width equal to or greater than that of the upper package 200. In the present example embodiment, the mounting space may have a first width W1, and the upper package 200 may have a second width W2 The first width W1 may be equal to or greater than the second width W2, and thus, the upper package 200 may be disposed on the lower package 100. By virtue of the presence of the guide portion 144, it is possible to guide the upper package 200 onto the lower package 100 with increased precision of alignment. In other words, when the upper package 200 is stacked on the lower package 100, the guide portion 144 may mitigate or prevent misalignment between the lower and upper packages 100 and 200 from occurring.

The guide portion 144 may have a vertical portion 144a and a tapered portion 144b, whose shapes are different from each other. The vertical portion 144a may have a uniform width and may extend from the central portion 142 in the vertical direction. By contrast, the tapered portion 144b may have a width gradually or monotonically decreasing in the vertical direction. For example, the tapered portion 144b may be formed such that its inner side surface facing the upper package 200 has an ascending slope. According to another example embodiment, the vertical portion 144a may be formed such that its inner side surface facing the upper package 200 is perpendicular to a top surface of the lower package 100.

Figure 2:
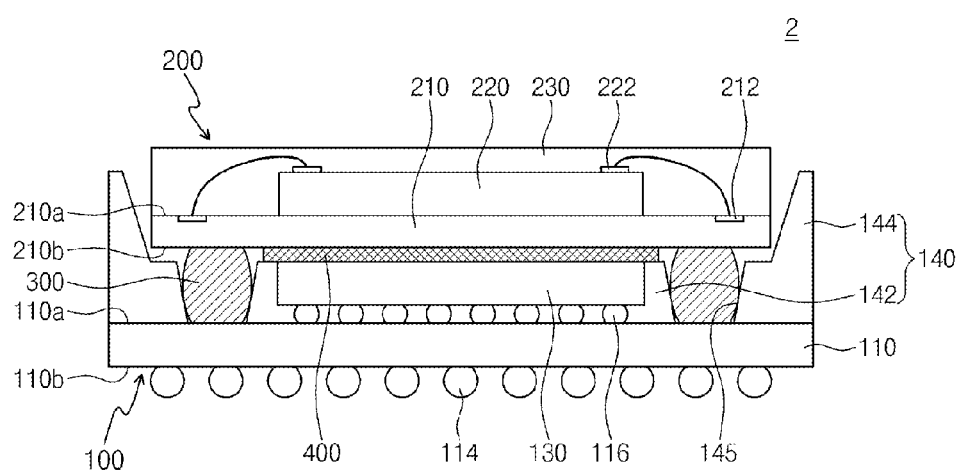
FIG. 2 is a sectional view illustrating a semiconductor package according to an example embodiment of the inventive concepts.

As another example, in the case of a semiconductor package 2 shown in FIG. 2, the guide portion 144 may have a tapered shape having a width decreasing in the vertical direction as being farther away from the central portion 142. For example, the guide portion 144 may be formed to have an inner side surface with an ascending slope.

Figure 3:
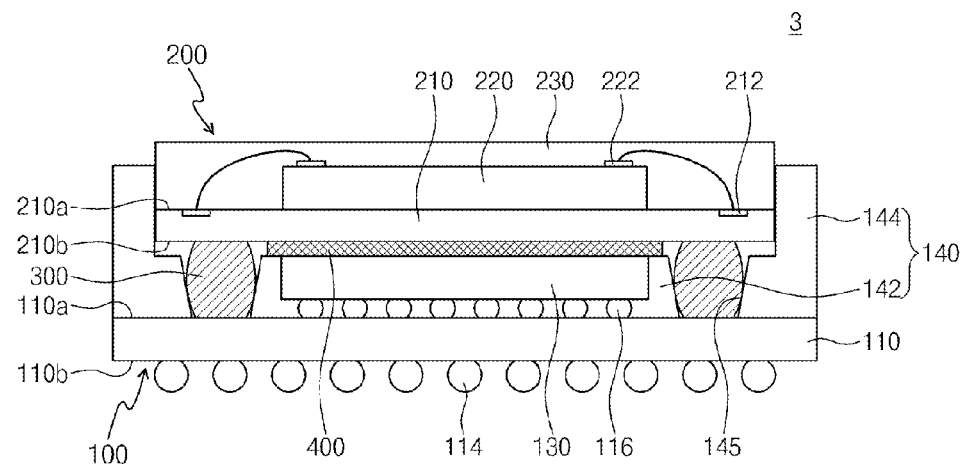
FIG. 3 is a sectional view illustrating a semiconductor package according to an example embodiment of the inventive concepts.

As other example, in the case of a semiconductor package 3 shown in FIG. 3, the guide portion 144 may have a vertical pillar shape, which has a uniform width in the vertical direction regardless of its distance from the central portion 142. For example, the guide portion 144 may have an inner side surface perpendicular to the top surface of the lower package 100.

A planar shape of the guide portion 144 will be described with reference to FIGS. 8 through 11.

Referring back to FIG. 1, the upper package substrate 210 may be a printed circuit board (PCB) with circuit patterns. The upper package substrate 210 may have a bottom surface 210b facing the lower package substrate 110 and a top surface 210a opposite to the bottom surface 210b. At least one first metal pad 212 may be provided on the upper package substrate 210. For example, a plurality of first metal pads 212 may be provided on both side edges of the top surface 210a of the upper package substrate 210.

The upper semiconductor chip 220 may be mounted on the top surface 210a of the upper package substrate 210. For example, the upper semiconductor chip 220 may be at least one of a memory chip, logic chip, or a combination thereof. The upper semiconductor chip 220 may be mounted on the upper package substrate 210 using a wire bonding technology. At least one second metal pad 222 may be provided on the upper semiconductor chip 220. The second metal pad 222 may be connected to the first metal pad 212 through wires. The upper semiconductor chip 220 may be mounted using a flip-chip bonding technology. The upper semiconductor chip 220 may include a plurality of semiconductor chips. The plurality of semiconductor chips may be connected to each other in a flip-chip bonding manner.

The upper mold layer 230 may be provided on the upper package substrate 210. The upper mold layer 230 may be formed of or include, for example, an insulating polymer material (e.g., an epoxy molding compound (EMC)). The upper mold layer 230 may be provided to cover the upper semiconductor chip 220.

Figure 4:
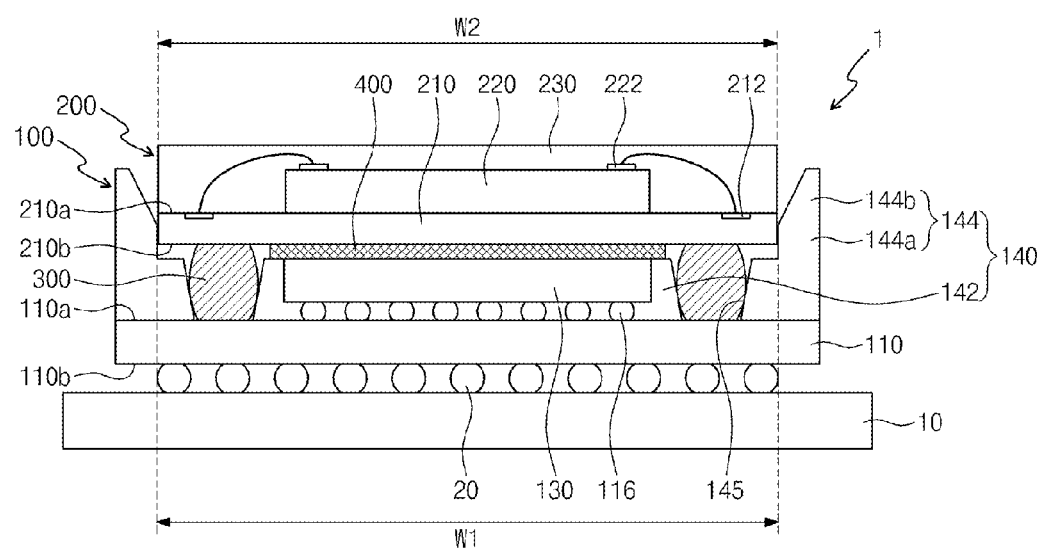
FIG. 4 is a sectional view illustrating a semiconductor package according to an example embodiment of the inventive concepts.

FIG. 4 is a sectional view illustrating a semiconductor package according to an example embodiment of the inventive concepts.

Referring to FIG. 4, the semiconductor package 1 may be stacked on a board 10. The board 10 may be a part of mobile products (e.g., cellular phones) or a memory module. For example, the lower semiconductor chip 130 may be an application processor, and the upper semiconductor chip 220 may be a memory chip. A one-pass reflow process may be performed to sequentially stack the lower package 100 and the upper package 200 on the board 10. The one-pass reflow process may include stacking the lower package 100 on the board 10, stacking the upper package 200 on the lower package 100, and then, performing a reflow process on the resulting structure. The upper mold layer 230 may be provided during or before the one-pass reflow process. The one-pass reflow process may be performed without a stack boat, and in this case, the lower package 100 and the upper package 200 may be stacked on the board 10 in a relatively simple manner. A board connecting element 20 may be provided between the board 10 and the lower package substrate 110 to electrically connect the board 10 to the semiconductor package 1.

FIGS. 5A through 5E are sectional views illustrating a method of fabricating a semiconductor package according to an example embodiment of the inventive concepts.

Figure 5A:
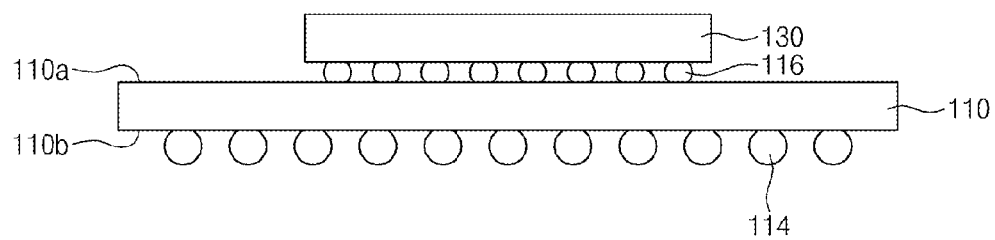
FIGS. 5A through 5F are sectional views illustrating a method of fabricating a semiconductor package according to an example embodiment of the inventive concepts.

Referring to FIG. 5A, the lower semiconductor chip 130 may be mounted on the top surface 110a of the lower package substrate 110. The outer terminal 114 may be provided on the bottom surface 110b of the lower package substrate 110. The connection terminal 116 may be disposed between the lower semiconductor chip 130 and the lower package substrate 110. The connection terminal 116 may electrically connect the lower semiconductor chip 130 to the lower package substrate 110.

Figure 5B:
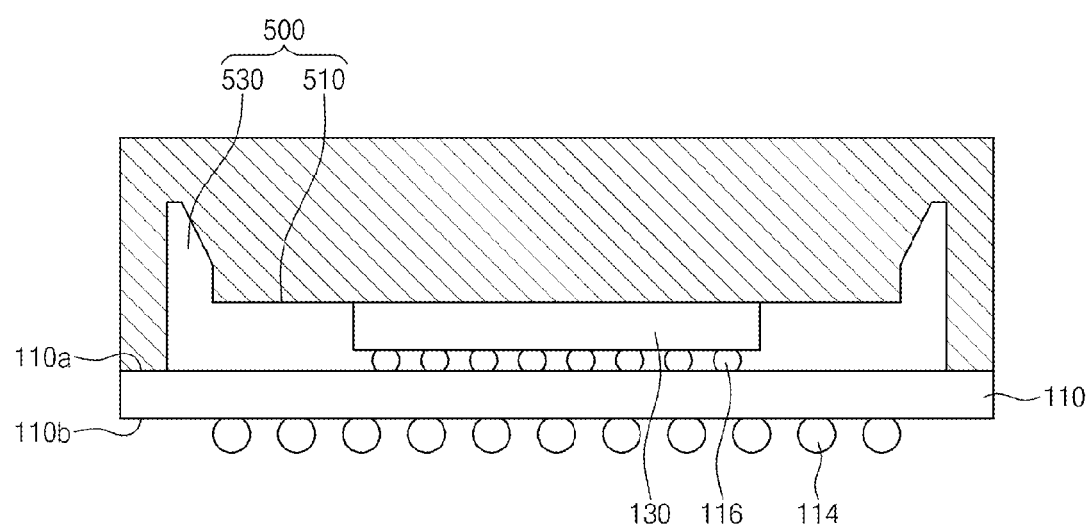

Referring to FIG. 5B, a molding die 500 may be provided on the lower package substrate 110. The molding die 500 may be formed to have a space to be filled with a molding material. The molding die 500 may be provided to cover the lower semiconductor chip 130. The molding die 500 may have a bottom surface that is in contact with the top surface 110a of the lower package substrate 110. The molding die 500 may include a flat portion 510 and a concave portion 530. The flat portion 510 may be in contact with the top surface of the lower semiconductor chip 130. The flat portion 510 may cover a central portion (on which the lower semiconductor chip 130 is mounted) of the lower package substrate 110, and be extended to an edge portion of the lower package substrate 110. The concave portion 530 may have a recessed profile in the vertical direction from the edge of the lower package substrate 110 toward the molding die 500. The concave portion 530 may include a first portion having a uniform width and a second portion extending vertically from the first portion and having a decreasing width (e.g., having an ascending slope when viewed from the lower package substrate 110) as being farther away from the lower package substrate. Shapes of the lower mold layer 140 and the guide portion 144 may be variously changed depending on appearances of the molding die 500.

Figure 6:
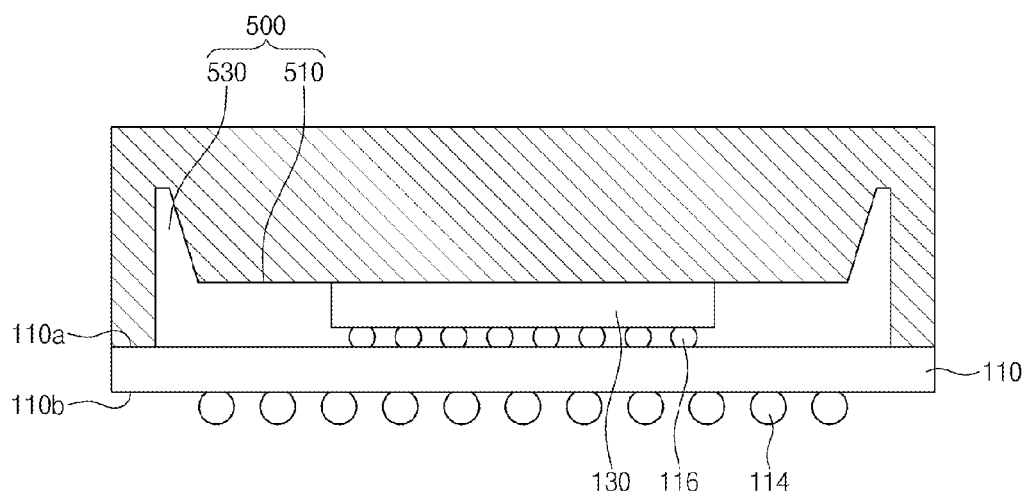
FIG. 6 is a sectional view illustrating a lower mold layer according to an example embodiment of the inventive concepts.

As another example, as shown in FIG. 6, the concave portion 530 may be recessed from an edge portion of the lower package substrate 110 toward the vertical direction to have an ascending slope with respect to the lower package substrate 110. The flat portion 510 may have substantially the same shape as that of FIG. 5B. The concave portion 530 may have a width gradually decreasing in the vertical direction as being farther away from to the lower package substrate 110. In other words, the concave portion 530 may have a tapered shape in the vertical direction.

Figure 7:
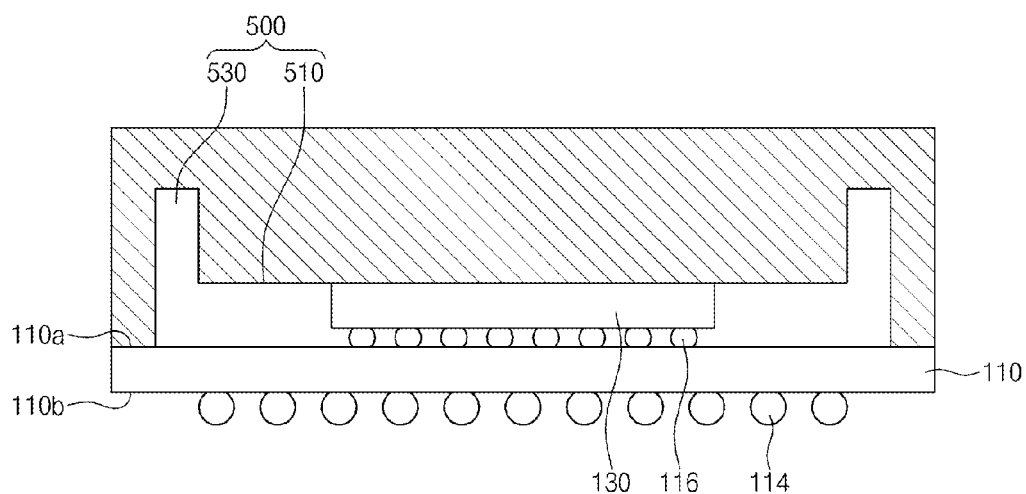
FIG. 7 is a sectional view illustrating a lower mold layer according to an example embodiment of the inventive concepts.

As other example as shown in FIG. 7, the concave portion 530 may be recessed from an edge portion of the lower package substrate 110 toward the vertical direction to have a uniform width. The flat portion 510 may have substantially the same shape as that of FIG. 5B.

Referring back to FIG. 5B, a molding material may be supplied into the molding die 500. The molding material may include, for example, an insulating polymer material (e.g., epoxy molding compound (EMC)).

Figure 5C:
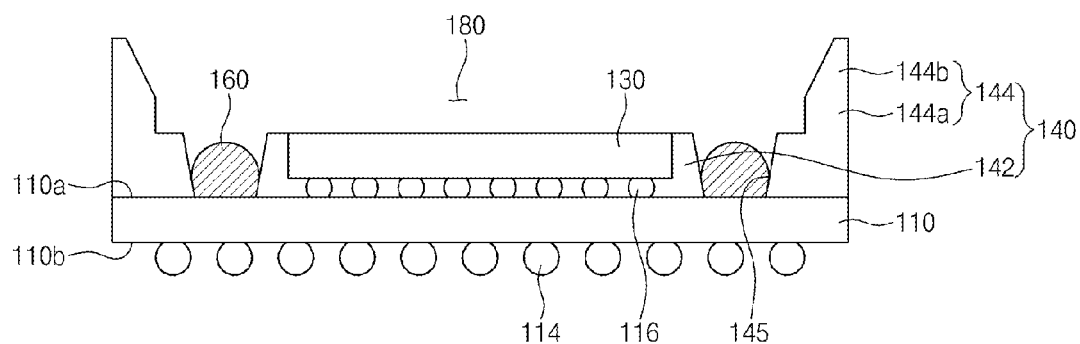

Referring to FIG. 5C, the molding material may form the lower mold layer 140 in the molding die 500. The lower mold layer 140 may be provided a mounting space 180, in which the upper package 200 will be contained. The mounting space 180 may be enclosed with and defined by the guide portion 144 of the lower mold layer 140. The connection hole 145 may be formed at the central portion 142 of the lower mold layer 140. The connection hole 145 may be formed spaced apart from the lower semiconductor chip 130. The connection hole 145 may be formed using at least one of laser drilling, mechanical drilling, and dry etching processes. The connection hole 145 may be formed to expose the top surface 110a of the lower package substrate 110. In some example embodiments, a plurality of connection holes 145 may be formed to be symmetric with respect to the lower semiconductor chip 130. A lower solder ball 160 may be provided in the connection hole 145. The lower solder ball 160 may be electrically connected to the lower package substrate 110.

Figure 5D:
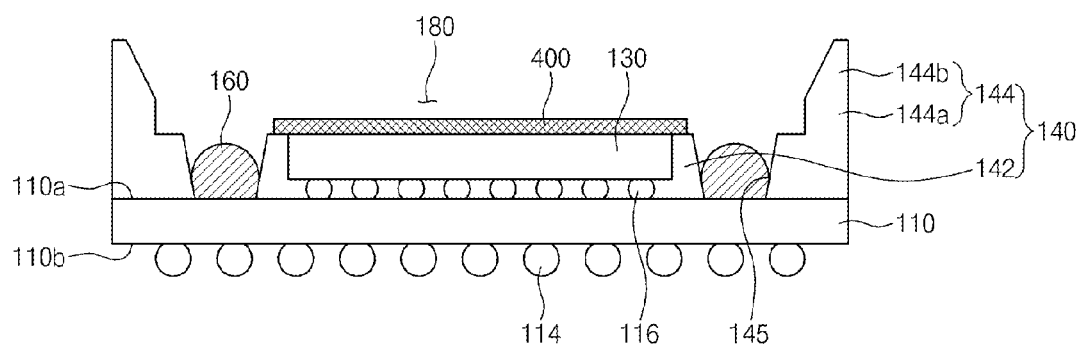

Referring to FIG. 5D, the heat transfer layer 400 may be provided on the lower semiconductor chip 130. The heat transfer layer 400 may be disposed on at least one of a portion of the top surface of the lower semiconductor chip 130 and a portion of the central portion 142 of the lower mold layer 140. For example, the heat transfer layer 400 may include, for example, a thermal interface material (TIM). The heat transfer layer 400 may be disposed spaced apart from the guide portion 144 of the lower mold layer 140 by a specific distance. The heat transfer layer 400 may allow heat generated in the lower semiconductor chip 130 to be easily dissipated to the outside. According to some example embodiments, the heat transfer layer 400 may be locally provided on the top surface of the lower semiconductor chip 130.

Figure 5E:
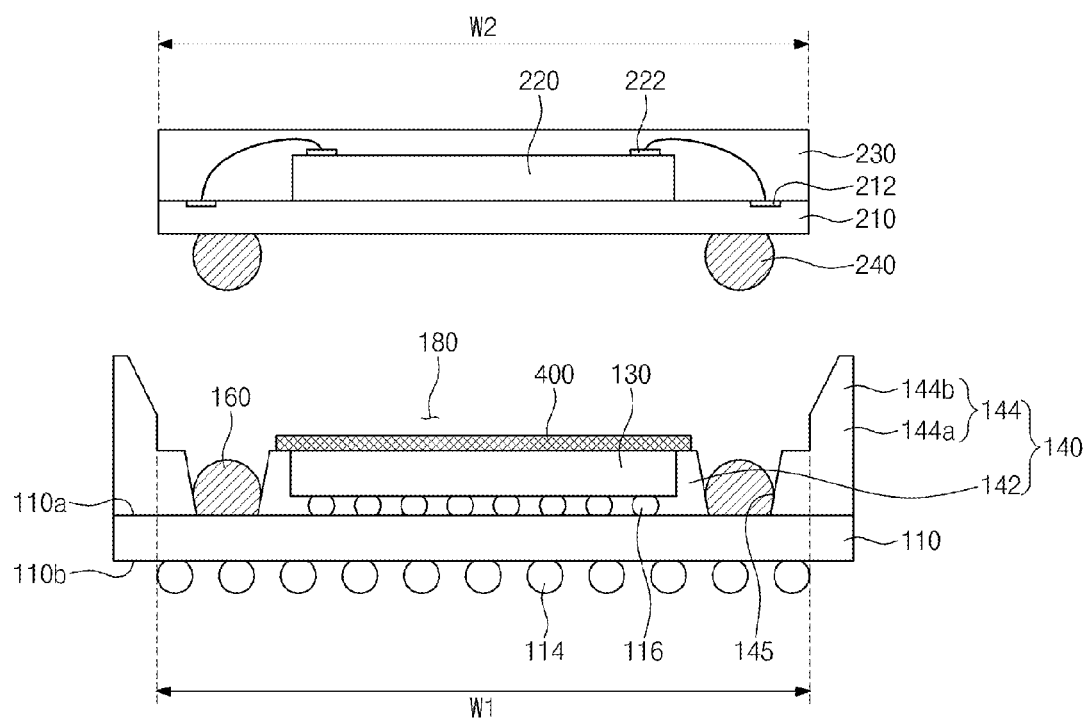

Referring to FIG. 5E, the upper package 200 may be provided. The upper package 200 may include the upper semiconductor chip 220 mounted on the top surface 210a of the upper package substrate 210 and the upper mold layer 230 encapsulating the upper semiconductor chip 220. An upper solder ball 240 may be provided on the bottom surface 210b of the upper package substrate 210. The upper solder ball 240 may be arranged such that its position can be overlapped with that of the connection hole 145, when viewed in a plan view. The upper semiconductor chip 220 may be connected to the package substrate 210 using a wire bonding technology. The first metal pad 212 may be formed on the upper package substrate 210, and the second metal pad 222 may be formed on the upper semiconductor chip 220. The first metal pad 212 and the second metal pad 222 may be electrically connected to each other. The upper mold layer 230 may be provided on the upper package substrate 210. The upper mold layer 230 may be provided to cover the top surface 210a of the upper package substrate 210 and the upper semiconductor chip 220.

The upper package 200 may be stacked on the lower package 100. The upper solder ball 240 may be inserted in the connection hole 145. A reflow process may be performed to connect the lower solder ball 160 to the upper solder ball 240, thereby forming the connection terminal 300. When the upper package 200 is stacked on the lower package 100, the guide portion 144 of the lower mold layer 140 may guide to align the upper package 200 to the lower package 100. For example, even if the upper package 200 is slightly misaligned to the lower package 100, the upper package 200 can be disposed on the lower package 100 without misalignment therebetween, because the tapered portion 144b of the lower mold layer 140 provides guidance allowing the upper package 200 to be located at its proper position. Thus, by virtue of the guide portion 144, the upper package 200 can be effectively aligned to the lower package 100.

A series of processes may be subsequent performed to fabricate the semiconductor package 1, in which the upper package 200 is stacked on the lower package 100.

Figure 5F:
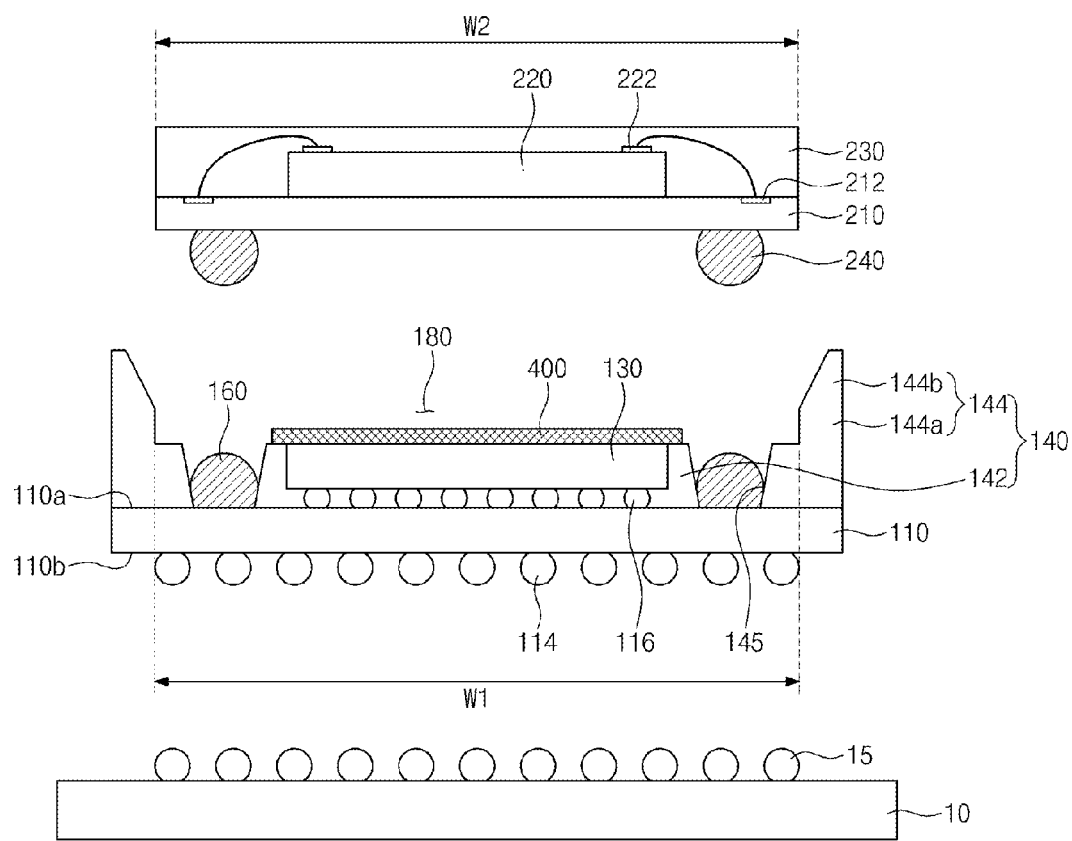

According to some example embodiment, as shown in FIG. 5F, the lower package 100 and the upper package 200 may be sequentially stacked on the board 10 using, for example, a one-pass reflow process. Accordingly, as shown in FIG. 4, the semiconductor package 1 may be mounted on the board 10. A board connection terminal 15 on the board 10 may be coupled to the outer terminal 114 of the lower package substrate 110, thereby forming the board connecting element 20. The lower solder ball 160 may be coupled to the upper solder ball 240, thereby forming the connection terminal 300. The board 10, the lower package 100, and the upper package 200 may be electrically connected to each other through the board connecting element 20 and the connection terminal 300.

FIGS. 8 through 11 are plan views illustrating semiconductor packages according to some example embodiments of the inventive concepts.

Figure 8:
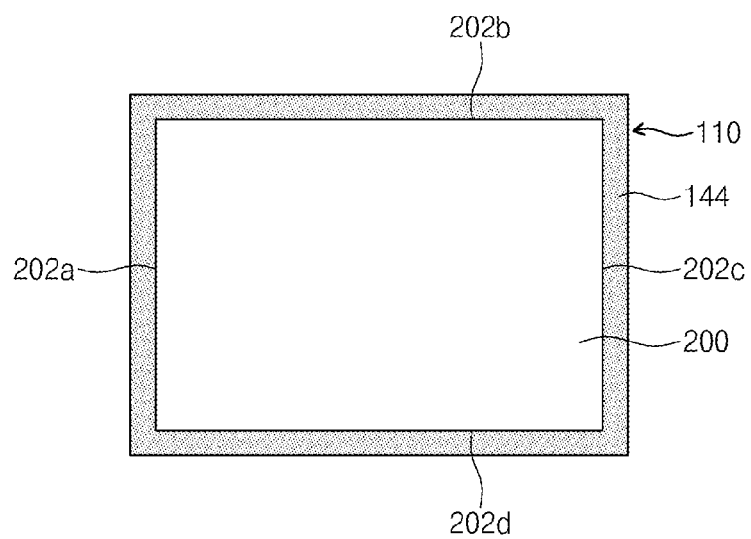
FIGS. 8 through 11 are plan views illustrating semiconductor packages according to an example embodiment of the inventive concepts.

Referring to FIG. 8, the guide portion 144 may be continuously provided along an edge of the lower package substrate 110 (or the central portion 142 of the FIG. 1). When viewed in a plan view, the upper package 200 may be a rectangle shape having four sides 202a, 202b, 202c, and 202d. The lower package substrate 110 may also be a rectangle shape. The guide portion 144 may be provided on the lower package substrate 110 (or the central portion 142 of the FIG. 1). When viewed in a plan view, the guide portion 144 may be a ring shape enclosing the upper package 200. When viewed in a vertical sectional view, as shown in FIG. 1, the guide portion 144 may be a wall shape extending from the central portion 142 in the vertical direction. The guide portion 144 may be extended to enclose all of the sides 202a, 202b, 202c, and 202d of the upper package 200.

Figure 9:
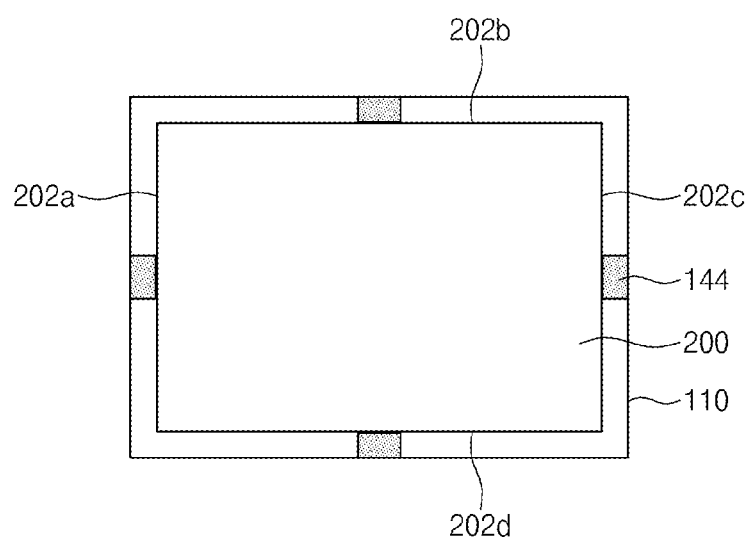

Referring to FIG. 9, the guide portion 144 may be provided to enclose the edge of the upper package 200 in a discontinuous manner. When viewed in a plan view, the guide portion 144 may include at least one portion, which is provided on a corresponding one of the four sides of the lower package substrate 110 and have a bar shape. For example, the guide portion 144 may be provided on a center of one side of the package substrate 110 (or the central portion 142 of the FIG. 1). According to some example embodiments, the guide portion 144 may be provided on at least two opposite sides of the lower package substrate 110 (or the central portion 142 of the FIG. 1). The guide portion 144 may be provided to partially enclose some of the side surfaces 202a, 202b, 202c, and 202d of the upper package

200. For example, the guide portion 144 may be provided to partially enclose each of the side surfaces 202*a*, 202*b*, 202*c*, and 202*d* of the upper package 200.

Figure 10:
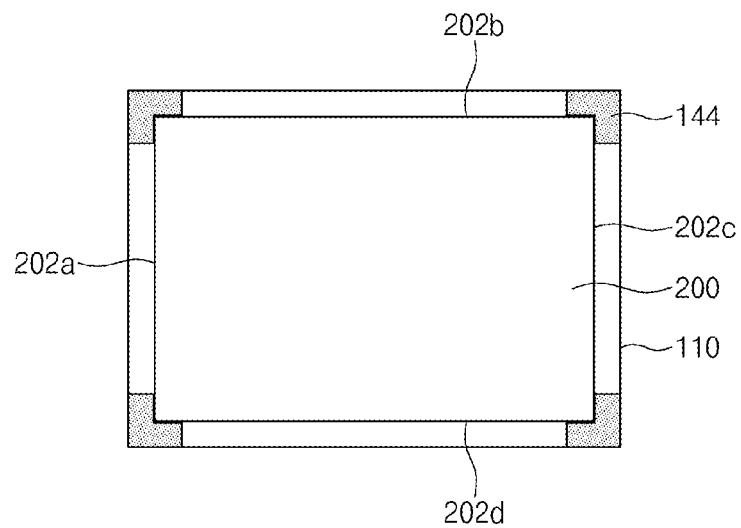

Referring to FIG. 10, the guide portion 144 may be provided to at the edge of the lower package substrate 110 (or the central portion 142 of the FIG. 1) in a discontinuous manner. When viewed in a plan view, the guide portion 144 may include at least one portion, which is provided on a corresponding one of four corners of the lower package substrate 110 (or the central portion 142 of the FIG. 1) and have a letter "L" shape. The guide portion 144 may be provided at four corners of the upper package 200, where the side surfaces 202*a*, 202*b*, 202*c*, and 202*d* of the upper package 200 meet each other.

Figure 11:
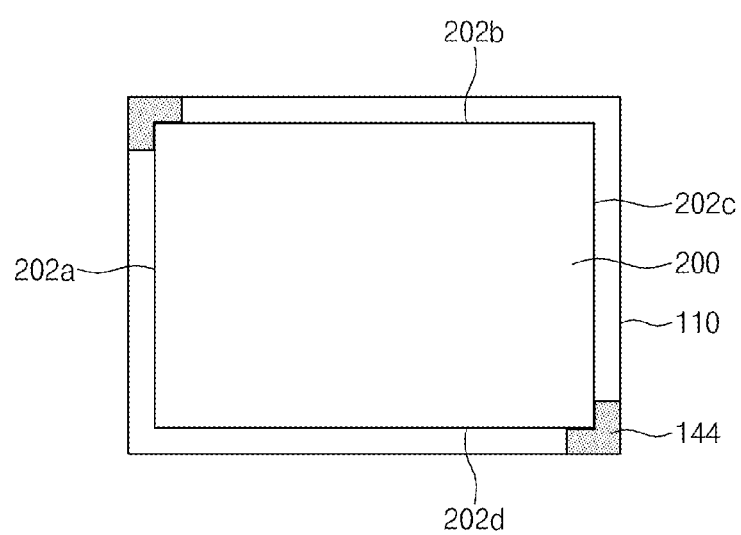

Referring to FIG. 11, the guide portion 144 may include two portions, which are provided on two opposite corners of the lower package substrate 110 (or the central portion 142 of the FIG. 1). Each of the two portion may have a letter "L" shape. The guide portion 144 may be provided at at least two opposite corners of the upper package 200, where the side surfaces 202*a*, 202*b*, 202*c*, and 202*d* of the upper package 200 meet each other.

shapes of the lower mold layer 140 have been described with reference the some accompanying drawings. However, the shapes of the lower mold layer 140 may vary. The shape of the guide portion 144 may also vary from the afore-described shapes.

Figure 12:
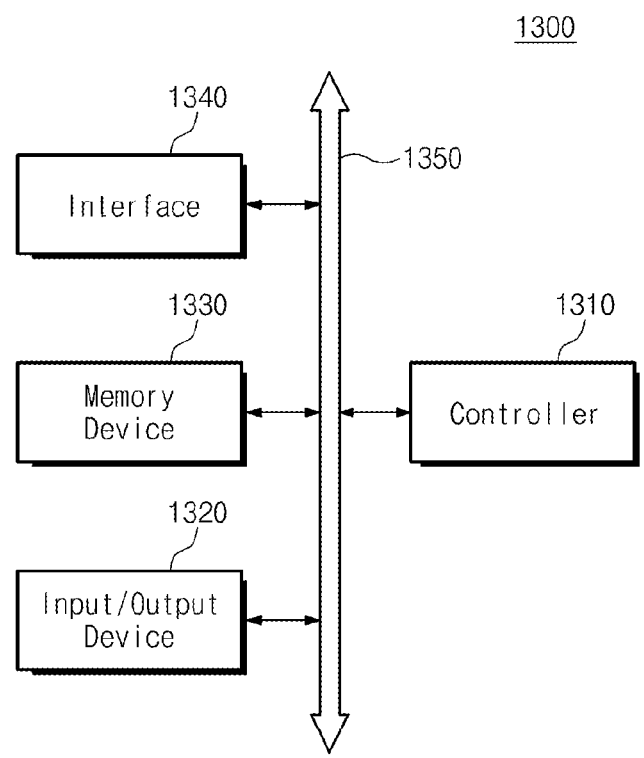
FIG. 12 is a block diagram illustrating an example of electronic systems including a semiconductor package according to an example embodiment of the inventive concepts.

FIG. 12 is a block diagram illustrating an example of electronic systems including a semiconductor package according to an example embodiment of the inventive concepts.

The semiconductor package according to the inventive concepts may be applied to an electronic system and may be configured to include a semiconductor memory device. Referring to FIG. 12, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include one of the semiconductor packages according to an example embodiment of the inventive concepts. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset, a camera image processor (CIS), and/or an input/output unit may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 13:
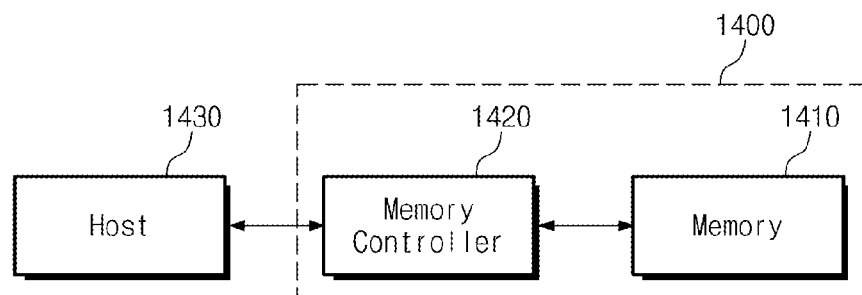
FIG. 13 is a block diagram illustrating an example of memory systems including a semiconductor package according to an example embodiment of the inventive concepts.

FIG. 13 is a block diagram illustrating an example of memory systems including a semiconductor package according to an example embodiment of the inventive concepts.

The semiconductor package may be provided in the form of a memory card. Referring to FIG. 13, a memory system 1400 may include a non-volatile memory device 1410 (e.g., a FLASH memory device) and a memory controller 1420. The non-volatile memory device 1410 and the memory controller 1420 may store data or read stored data. The non-volatile memory device 1410 may include at least one of the semiconductor packages according to an example embodiment of the inventive concepts. The memory controller 1420 may control the non-volatile memory device 1410 in order to read the stored data and/or to store data in response to read/write request of a host 1430.

According to example embodiments of the inventive concepts, a lower mold layer may be configured to have a guide portion, which mitigates or prevents misalignment between lower and upper packages from occurring.

According to example embodiments of the inventive concepts, the guide portion may include a tapered portion, which is configured to guide the upper package to the lower package when the upper package is moved and coupled to the lower package. The misalignment between lower and upper packages from occurring may be mitigated or prevented.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
    a lower package including a lower package substrate, a lower semiconductor chip on the lower package substrate, and a lower mold layer on the lower package substrate; and
    an upper package on the lower package, the upper package including an upper package substrate and an upper semiconductor chip thereon,
    wherein the lower mold layer comprises a guide portion extending vertically from an edge of the lower package, the guide portion defining a space in which the upper package is within the guide portion, and
    wherein the guide portion includes a first portion having a uniform width in the vertical direction and a second portion protruding from the first portion, the second portion having a width gradually decreasing in the vertical direction.

2. The semiconductor package of claim 1, wherein the guide portion is a tapered structure having a width decreasing in the vertical direction.

3. The semiconductor package of claim 1, wherein the guide portion is a pillar-shaped structure having a uniform width in the vertical direction.

4. The semiconductor package of claim 1, wherein when viewed in a plan view, the guide portion is continuously along the edge of the lower package substrate.

5. The semiconductor package of claim 1, wherein when viewed in a plan view, the lower package substrate has a rectangular shape, and the guide portion comprises at least two portions, which are respectively on at least two opposite corners of the lower package substrate.

6. The semiconductor package of claim 1, wherein when viewed in a plan view, the lower package substrate has a rectangular shape, and the guide portion comprises at least two portions, which are respectively on at least two opposite sides of the lower package substrate.

7. The semiconductor package of claim 1, further comprising:
a heat transfer layer between the lower semiconductor chip and the upper package substrate.

8. The semiconductor package of claim 1, further comprising:
an upper mold layer covering the upper semiconductor chip.

9. The semiconductor package of claim 1, wherein the space has a first width, the upper package has a second width, and
the first width is equal to or greater than the second width.

10. A semiconductor package, comprising:
a lower package including a lower package substrate, a lower semiconductor chip on the lower package substrate, and a lower mold layer on the lower package substrate; and
an upper package on the lower package, the upper package including an upper package substrate and an upper semiconductor chip thereon,
wherein the lower mold layer comprises a guide portion extending vertically from an edge of the lower package, the guide portion defining a space in which the upper package is within the guide portion, and
wherein when viewed in a plan view, the guide portion is discontinuously along the edge of the lower package substrate.

11. A semiconductor package, comprising:
a lower package including a lower package substrate, a lower semiconductor chip on the lower package substrate, and a lower mold layer on the lower package substrate, the lower mold layer including,
a first portion at and around the lower semiconductor chip, and
a second portion connected to the first portion at an edge of the lower package, the second portion extending in a vertical direction from the first portion to define a boundary; and
an upper package on the lower package, the upper package including an upper package substrate and an upper semiconductor chip thereon, the upper package residing within the boundary,
wherein a width of the second portion is uniform in the vertical direction.

12. The semiconductor package of claim 11, wherein when viewed in a plan view, the second portion includes at least two separate members on at least one of at least two opposite corners of the lower package substrate and at least two opposite corners of the lower package substrate.

13. The semiconductor package of claim 11, wherein when viewed in a plan view, the second portion is along the edge of the lower package substrate in one of a continuous manner and a discontinuous manner.

* * * * *